United States Patent [19]

Srivastava et al.

[11] Patent Number: 4,943,792
[45] Date of Patent: Jul. 24, 1990

[54] SUPERCONDUCTING SWITCH PACK

[75] Inventors: Vishnu C. Srivastava; John J. Wollan, both of Florence, S.C.

[73] Assignee: General Electric Company, Milwaukee, Wis.

[21] Appl. No.: 160,387

[22] Filed: Feb. 25, 1988

[51] Int. Cl.$^5$ ............................................. H01F 7/72
[52] U.S. Cl. ..................................... 335/216; 338/325
[58] Field of Search .................... 335/216; 338/325; 174/125.1

[56] References Cited

U.S. PATENT DOCUMENTS

| | | | |
|---|---|---|---|
| 3,054,978 | 9/1962 | Schmidlin et al. | 338/24 |
| 3,359,394 | 12/1967 | Mains | 200/166 |
| 3,715,703 | 2/1973 | Croso et al. | 338/325 |
| 4,010,047 | 3/1977 | Frohmader . | |
| 4,164,777 | 8/1979 | Kneip et al. | 338/325 |
| 4,586,017 | 4/1986 | Laskaris | 338/325 |
| 4,602,231 | 7/1986 | Purcell et al. | 335/216 |
| 4,635,015 | 1/1987 | Franksen | 335/216 |

OTHER PUBLICATIONS

"Critical Current and Stability Effects Between 0 and 6 Tesla in Mono and Multifilamentary NbTi Conductors Having A CuNi Matrix", HHJ ten Kate, AJM Roovers and LJM van de Klundert, *IEEE Transactions on Magnetics*, vol. MAG-21, pp. 363-365, Mar., 1985.

*Primary Examiner*—George Harris
*Attorney, Agent, or Firm*—Quarles & Brady

[57] ABSTRACT

A superconducting switch pack has six switch elements arranged with three in each of two planes. Each switch element is made of a length of cupro-nickel matrix multi-filamentary superconducting wire which is formed into a serpentine shape so as to be bifilar. Primary and back-up heater elements are positioned between the planes of switch elements, and all of the switch elements and heater elements are encapsulated in a solid resin body, with their leads extending outside of the body for connection to electrical circuits. This construction results in a stable superconducting switch pack which is non-inductive, has a high current carrying capability and off resistance. This reduces cryogen boil off of the superconductive circuits connected to the switch pack and makes the switch pack particularly suited for the shim coils of an MR magnet. Each section of the switch pack can also keep magnetic field drifts of the individual superconductive coils to less than 0.1 ppm/Rour and a number of superconducting coil can be simultaneously switched.

12 Claims, 3 Drawing Sheets

U.S. Patent  Jul. 24, 1990  Sheet 1 of 3  4,943,792
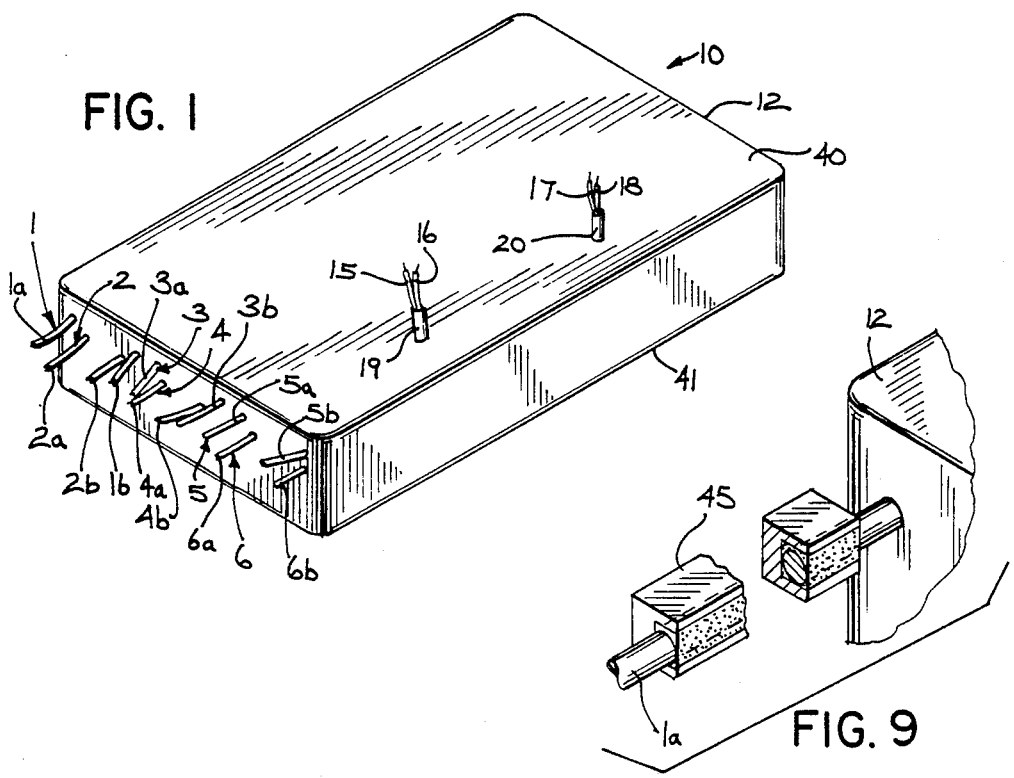
FIG. 1
FIG. 9
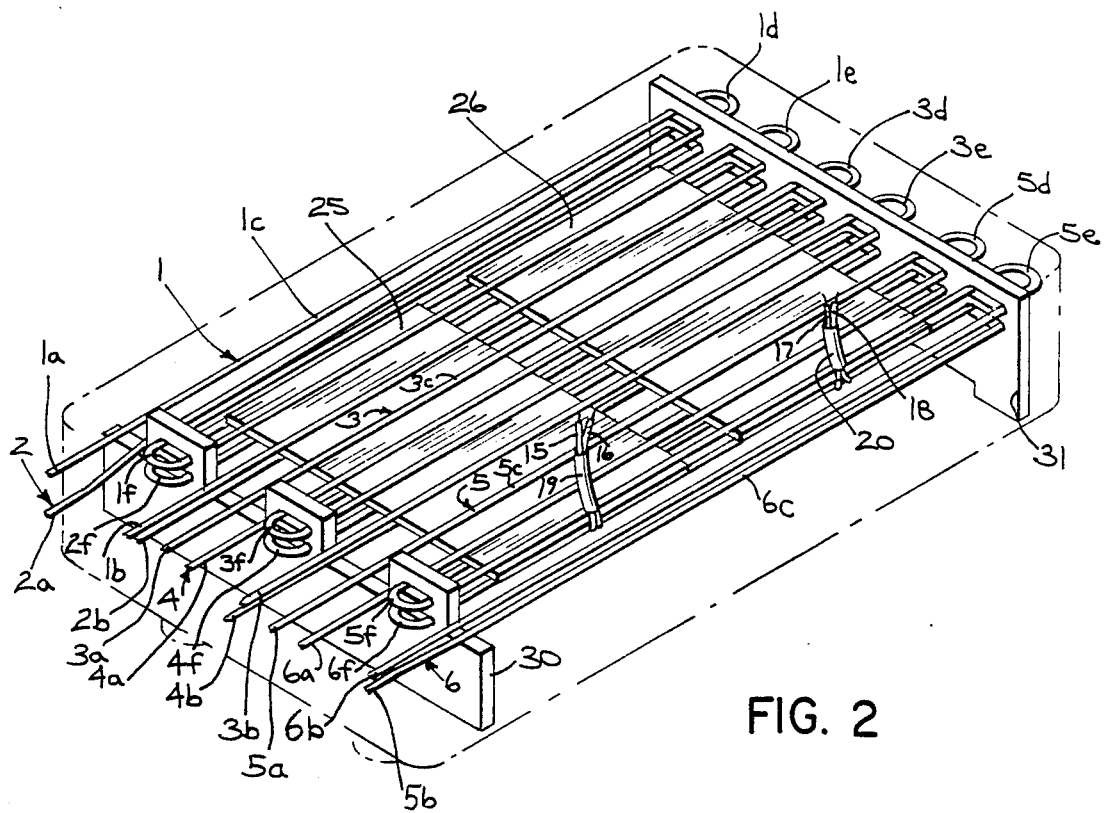
FIG. 2

SUPERCONDUCTING SWITCH PACK

BACKGROUND OF THE INVENTION

1. Field Of The Invention

This invention relates to thermally controlled persistent current switches for superconductive circuits, and more particularly to a construction of a switch pack having several such switches with each switch employing a cupro-nickel matrix superconductor and being capable of simultaneously switching a number of coils.

2. Discussion Of The Prior Art

Switches for turning superconductive magnet circuits on and off are well known. They typically comprise a length of superconductive wire and a heater element. The switch is cooled to a temperature well below the critical temperature of the superconductor (e.g., 9° Kelvin) by immersing it in a cryogen such as liquid helium. At or below the critical temperature, the resistance of the wire falls to zero, thereby making the wire superconductive. In the superconductive or persistent state, the switch is "on" because it has no resistance. The switch is turned off by turning the heater element on, which raises the temperature of the superconductive wire above the critical temperature, thereby producing a finite resistance to the flow of current.

Switches of this type are often used in circuits which include a superconductive magnet coil, such as in a magnetic resonance (MR) scanner. There may be many superconductive magnet coils, each having its own switch, which cooperate to produce a desired magnetic field. As such they are inductively coupled, i.e. the portion of the magnetic field which each contributes is affected by the magnetic fields which the other magnets produce. Changing the current through one of the coils changes the magnetic field it produces, which changes the current through any other coils inductively coupled with that coil, which changes their magnetic fields, which changes the current through the first coil, etc. Thus, inductive coupling creates a problem in adjusting the current through each magnetic coil because of their interrelationships. Also, individually adjusting each coil would result in a relatively large boil-off of liquid helium because of the time and number of changes in current which would be required.

This problem is overcome by switching all the inductively coupled magnet coils substantially simultaneously. During charging, each switch is connected in parallel with the corresponding magnet coil and a power supply for the particular switch which is adjustable to ramp up to the desired current through the coil at the same time that the desired currents through all the other coils are reached. During ramping, the switches are off. At the time the desired currents are reached, all of the switches are turned on at substantially the same time to conduct the persistent current and the power supplies are disconnected.

The coils of superconductive switches have been made up of whatever length of superconductive wire is necessary to achieve the desired resistance in the "off" state and provide a great enough heat capacitance in the switch to avoid damage when the switch is off. In prior switches which have employed copper matrix superconductor, a relatively long wire has been required to achieve even a relatively small resistance. Because of the small resistance, the switch also had to be able to absorb large amounts of energy. For example, in one such switch, 280 feet of copper matrix superconductor was required to achieve a resistance of approximately 0.05 Ω at 10°-20° K. A higher resistance is desirable because it allows less energy absorption by the switch when it is off, thereby reducing the boil-off of the cryogen during charging and discharging of the superconducting circuit.

Another consideration in superconductive switches is current carrying capacity. Copper matrix switches have generally been capable of high current densities, but at the expense of the relatively poor "off" characteristics referred to above.

Cupro-nickel matrix superconductors are known to have higher "off" resistance than copper matrix superconductors. However, cupro-nickel matrix superconductors are inherently extremely unstable. Slight movements in a magnetic field can cause them to "quench", losing their ability to conduct at zero resistance.

SUMMARY OF THE INVENTION

The invention provides a superconducting switch pack to overcome the above problems. In the switch pack, each of two or more switch elements includes a length of superconductive wire which has a switching portion between two lead portions. The switching portions are each supported in a common mold and a hardenable resin is poured into the mold to encapsulate the switching portions in a solid body. When it is hardened, the solid body is then removed from the mold and defines the exterior of the switch pack. The switch pack has excellent thermal and mechanical properties which allow the switch elements to attain a high electrical rating.

In the preferred mode, each switch element is made from a length of superconducting wire having a cupro-nickel matrix. With this type of wire, each switch element can be relatively short. Furthermore, the mechanical and thermal properties of the switch pack make it possible to overcome the inherent instability of this type of wire.

In the embodiment disclosed, the switching portion of each switch element is substantially supported in a plane by the support means. The switching portions of the switch elements lie in at least two planes, and the planes are parallel and spaced apart with a heater element disposed between the planes and in thermal contact with the switching portions. With the switching portions arranged in planes, the solid body may be in the shape of a parallelepiped, with flat faces parallel and adjacent to the planes of the switching portions which provide large surfaces for heat transfer from the switching portions.

Preferably, each switching portion is bifilar so that adjacent sections carry the current through the switching portion in substantially opposite directions. This may be accomplished in the planar arrangement of the switching portions by forming the switching portions to have a serpentine shape in the solid body. The heater element should be between the planes so that it is on the side of each plane which is opposite from the exterior face of the solid body.

A supplemental conductor may be soldered to each of the lead portions. This has the effect of increasing the ability of the switch pack to dissipate energy, as is sometimes required when it is turned off or becomes nonpersistent.

It is therefore a principal object of the invention to provide a superconducting switch pack having two or more circuits using cupro-nickel matrix superconducting wire.

It is another object of the invention to provide a superconducting switch which is smaller and uses less superconductor than prior switches with similar ratings.

It is another object of the invention to provide such a superconducting switch which is stable in a magnetic field.

It is another object of the invention to provide such a superconducting switch which has a relatively high resistance above the critical temperature.

It is another object of the invention to provide such a superconducting switch which has a relatively low cryogen (liquid helium) boil-off during charging and discharging of a superconductive circuit connected in parallel with it.

It is another object of the invention to keep the equivalent magnetic field drifts for a circuit connected in parallel with it to less than 0.1 ppm/hour.

It is another object of the invention to provide simultaneous switching of several superconducting circuits with different operating currents and to reduce the cryogen (liquid helium) boil off by relying on a single common heater element for switching.

It is another object of the invention to provide such a superconducting switch pack which does not interfere with a magnetic field.

These and other objects of the invention will be apparent from the drawings and from the detailed description.

DESCRIPTION OF THE DRAWINGS

FIG. 1 is a perspective view of the exterior of a switch pack of the present invention;

FIG. 2 is a perspective view like FIG. 1, but showing the encapsulated components of the switch with the exterior in phantom outline;

FIG. 9 is a fragmentary perspective view of an alternate lead construction for the switch pack of FIG. 1.

DETAILED DESCRIPTION OF THE PREFERRED EMBODIMENT

FIG. 1 discloses a switch pack 10 of the present invention. The exterior of the switch pack 10 is defined by a parallelepiped shaped polyhedron, hereby designated solid body 12, and lead portions 1a–6a and 1b–6b out through the front of the solid body 12. In the preferred embodiment illustrated, heater leads 15, 16, 17 and 18, and Teflon tubing insulation 19 and 20, also help define the exterior of the switch pack 10.

Figure 3:
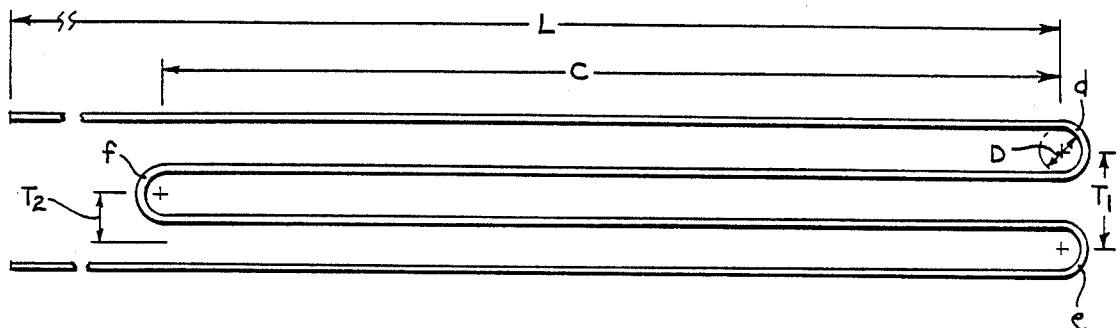
FIG. 3 is a detail view illustrating the shape of each switch element of the switch pack.
Figure 5:
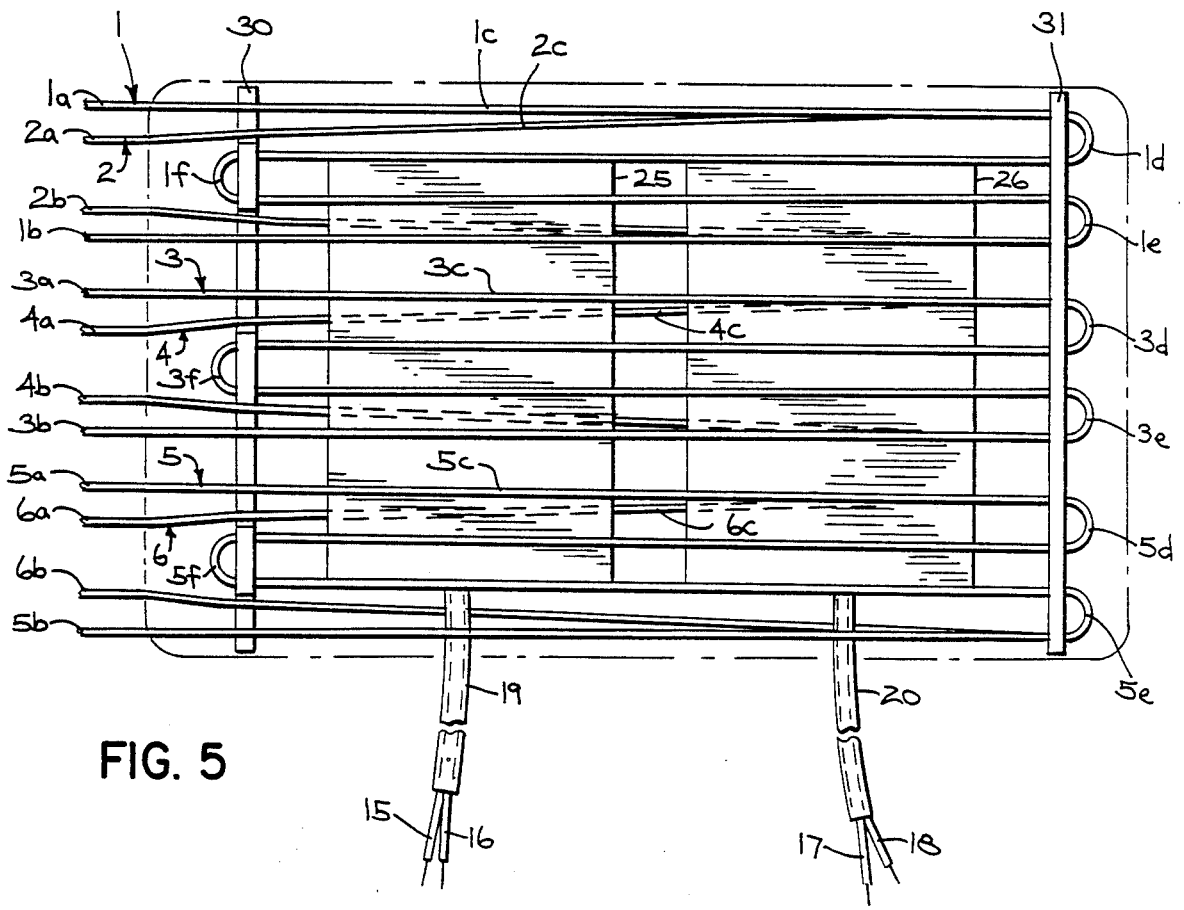
FIG. 5 is a top plan assembly view of the encapsulated components of the switch pack prior to molding.
Figure 6:
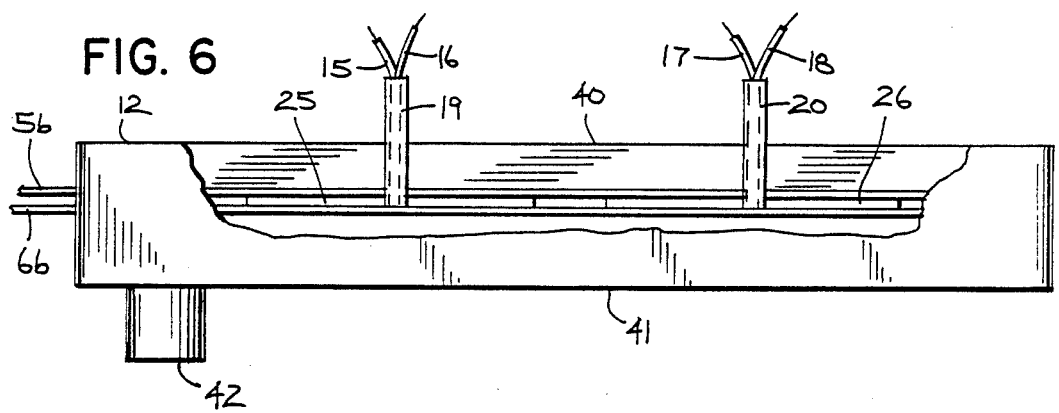
FIG. 6 is a side elevation view of the switch pack with a portion broken away.

Referring to FIGS. 2, 5 and 6, each set of lead portions 1a and 1b, 2a and 2b, etc. are the end portions of switch elements 1, 2, etc. In addition to the end portions a and b, each switch element 1-6 includes a switching portion 1c–6c which is inside the solid body 12. Each switching portion 1c–6c is formed as shown in FIG. 3 to take a serpentine path through the solid body 12. The serpentine path in the preferred embodiment of each switching portion 1c–6c lies in a single plane and takes three changes of direction d-f (with one radius f at the front and two radii d and e at the rear) which are substantially 180°. The switching portion of each switch element is made serpentine so as to make it as bifilar as possible. Thus, adjacent legs of the switching portion carry the current through the switching portion in substantially opposite directions. The magnetic field produced by each leg is largely cancelled by the adjacent leg so that the switch element produces little or no magnetic field of its own.

Figure 4:
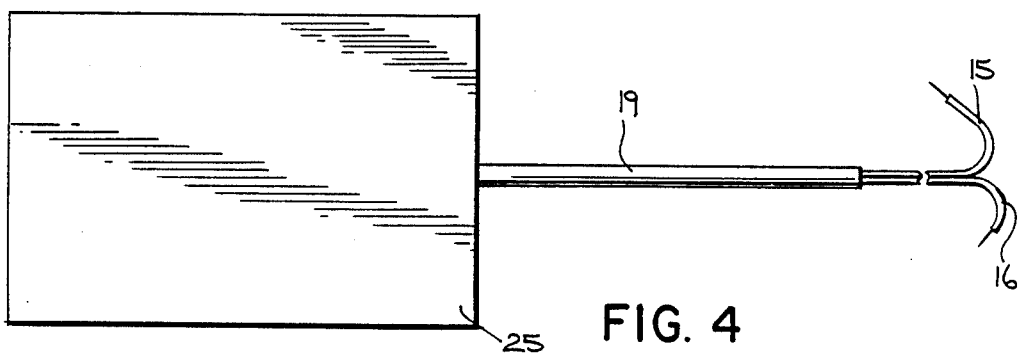
FIG. 4 is a top plan view of a heater element for the switch pack.
Figure 8:
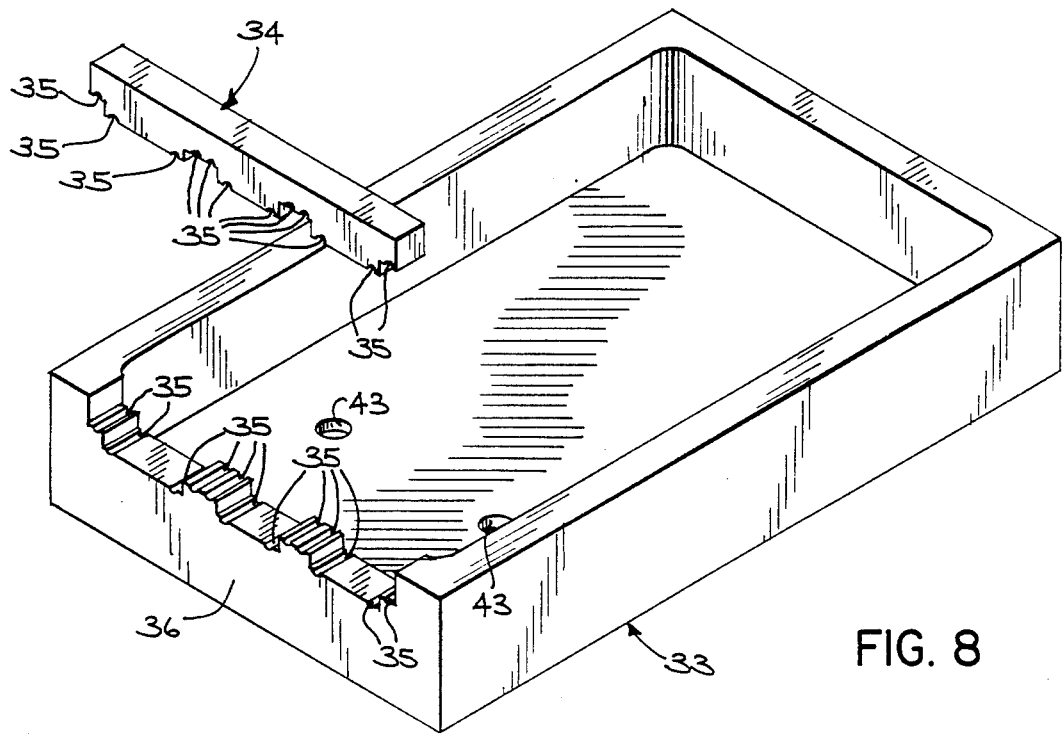
FIG. 8 is an exploded perspective view of a mold for the switch pack of FIG. 1.

The switching portions 1c, 3c, and 5c define an upper plane and the switching portions 2c, 4c and 6c define a lower plane. Between the upper and lower planes defined by the switching portions 1c, 3c and 5c, and the switching portions 2c, 4c and 6c, respectively, are disposed two planar foil heater sheets 25 and 26. The heater sheets 25 and 26 are identical, and the heater sheet 25 is shown in FIG. 4. Such heater sheets, which typically include a nickel-chromium heater are commercially available in varying resistances. In the preferred embodiment, the resistance of each heater sheet 25 and 26 is nominally 5.3 ohms. Two heater sheets 25 and 26 are employed so that if one of the heater sheets malfunctions, the other can be relied upon to turn the switch pack 10 off. The switch pack 10 is a molded resin composite structure. FIG. 8 shows a mold 33 for the switch pack 10. Front and rear supports 30 and 31 (FIGS. 2 and 5), which are made of Bakelite, are placed in the mold 33 and each preformed switch element 1-6 is placed in the mold with its radii d and e supported in horizontal slots in the rear support 31 and its radius f in a horizontal slot in the support 30. The switch elements 2, 4 and 6 are placed in the mold first, followed by the heater sheets 25 and 26, and then the switch elements 1, 3 and 5. Then, the lead portions 1a–6a and 1b–6b are held in position by piece 34, which is formed to mate with the front of the mold body 36 and define passages 35 through which the lead portions extend. The piece 34 is secured to the mold 33 with appropriate bolts or clamps (not shown). Then, the mold 33 is filled with resin and preferably put on a vibrating table to remove any air bubbles in the resin. The resin is then cured, which, depending upon the resin, may require heating the assembly.

The resin used should be one that cures hard and solid, and maintains strength at the temperature of the cryogen in which it is immersed (for liquid helium, 4.2° K.). Also, the thermal conductivity and thermal capacitance of the resin should be as high as possible. In the preferred embodiment, the resin used is an epoxy which is commercially designated Stycast TM #2850GT with catalyst #9, sold by ACCRAbond, Inc., Olive Branch, MS. The Stycast TM resin used in the preferred embodiment is vibrated for approximately one-half hour to remove air bubbles from the mold 33 and the entire assembly is then baked in an oven at 50° C. ±10° C. for two hours to cure the epoxy completely. Other resins, for example polyesters, may be suitable for other applications depending on the thermal conductivity, thermal capacitance, strength, hardness, and low temperature characteristics required.

The superconducting wire used for the switch elements 1-6 is a cupro-nickel matrix niobium-titanium multifilamentary (576 filaments) superconducting composite conductor. Preferably, the superconducting material of the filaments is 46.5 plus or minus 1.5 weight percent titanium. The matrix material is 70% copper, 30% nickel with a nominal resistivity of $3.2 \times 10^{-5}$ ohm-cm at room temperature. The outer jacket of the wire is 90% copper, 10% nickel with a nominal resistivity of $1.5 \times 10^{-5}$ ohm-cm at room temperature. The volume ratio of cupro-nickel to niobium-titanium is nominally 1.10:1 in the final conductor. Each wire is also fully cured formvar varnish coated for insulation.

The diameter of each wire prior to insulation is preferably 0.041 inches nominally. The insulated wire diameter is nominally 0.044 inches. The equivalent average filament size in the final conductor is preferably 29 microns in diameter nominally and should not be greater than about 32 microns. The twist pitch length of the wire should be 1.0 plus or minus 0.25 inches. As such, the minimum critical current of this wire should be 630 amps in a magnetic field of 5 Tesla at 4.2 degrees Kelvin.

Referring to FIG. 3, in comparison to prior switches used for similar applications, the length of each switch element of the switch pack 10 is short. The nominal center to center distance C between the radii d and e and the radius f is 5.81 inches. The nominal transverse center to center distance $T_1$ between the radii d and e of any switch element 1-6 is 0.60 inches and the distance $T_2$ from the center of the radius f to the center of the radius e is nominally 0.30 inches. The diameter D of each of the radii d-f is nominally 0.29 inches. From the centers of the radii d and e, the length L of each switch element extends at least 60 inches to allow sufficient length for forming a superconductive joint between the switch element and the leads (not shown) from the superconductive circuit in which the switch element is to be incorporated. A method of forming a superconducting joint between each switch element 1-6 and such leads is disclosed in commonly owned copending U.S. patent application Ser. No. 0/157,345, filed Feb. 17, 1988, entitled Method and Apparatus For Making a Superconducting Joint.

The solid body 12 has upper and lower planar faces 40 and 41 (FIGS. 1, 6 and 7) which are substantially parallel to the planes of the switch elements. This provides a large surface in direct contact with the cryogen to provide a large capacity for heat transfer from the encapsulated portions of the switch elements 1-6 to the cryogen and vice versa to cool it down to low temperatures. The encapsulating strength of the resin is also important for the stability of the switch elements because cupro-nickel matrix superconductors are extremely sensitive to motion when they are in a magnetic field.

The large faces 40 and 41 also cooperate with the heater elements 25 and 26 to turn off the switch elements when so desired. When one of the heater sheets 25 or 26 is energized, heat is drawn from the heater sheet by the sides 40 and 41 so that it must pass through the planes of the switch elements 1-6. Thus, the switch elements are warmed and thereby turned off as the heat flows from the heater sheet to the planar faces 40 and 41 of the solid body 12.

Figure 7:
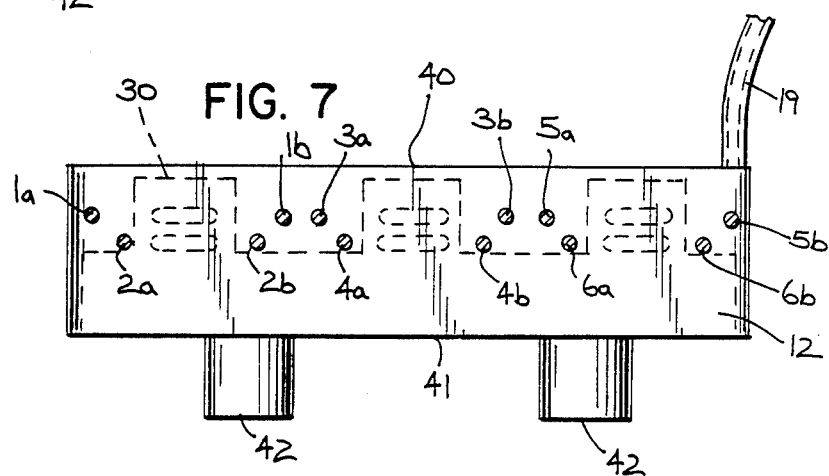
FIG. 7 is a front elevation view of the switch pack of FIG. 1.

The switch elements 1-6 and heater sheets 25 and 26 are all arranged on one side of the solid body 12 so that they are closer to the face 40 than to the face 41 as best shown in FIG. 7. The additional resin material between the switch elements and the face 41 is provided mainly for additional mechanical strength.

Screws (not shown) may be provided in the bottom of the mold 33 to facilitate removing the solid body 12 from the mold. Also, lands 42 are molded by recesses 43 in the mold body 36 as a part of the solid body 12 and may be used to mount the solid body 12 rigidly, such as by screwing appropriate fasteners into them to secure the solid body 12 to a stationary structure.

Each switch element has a resistance of approximately one ohm when off and is capable of conducting a persistent current of up to 400 amperes. Also, each wire may carry a different current. However, the switch elements are not completely independent because they will all be turned on and off substantially simultaneously by energizing or deenergizing one of the heater sheets 25 and 26.

An important characteristic of the switch pack 10 is that it is able to dissipate a large amount of energy. This becomes necessary when the switch pack is turned off by energizing one of the heaters 25 and 26 or when for some other reason (i.e. quenching) the switch enters the non-persistent state. At that time, unless a separate dump resistor is provided in the superconducting circuit, the switch pack 10 must dissipate all of the energy which was previously in the circuit.

Tests of a switch pack constructed as described above revealed that, when immersed in liquid helium, it could dissipate an initial input of up to approximately 5 kiloJoules of electrical energy before the lead portions 1a-6a and 1b-6b became susceptible to burning out. The switching portions 1c-6c inside the solid body 12, however, did not burn out. It is believed that they did not burn out because of the ability of the switch pack 10 to transfer heat from each switch element.

To increase the electrical capacity of the switch pack 10, the lead portions 1a-6a and 1b-6b may be modified as shown in FIG. 9. In this modification, a supplemental conductor, such as a channel 45 made of oxygen free high conductivity copper, is soldered to the lead portion (here lead portion 1a is shown) along its length. The channel 45 is a 0.10 by 0.10 inch bar with a groove machined in the bar which is 0.041 deep and slightly wider than the wire. The channel 45 not only adds to the heat capacitance of the lead portion, but also conducts most of the current when the switch pack is used as a dump resistor. The other function of the channel 45 is that it increases the surface area for heat transfer to the liquid cryogen.

This has been found to keep the lead portion from burning out at 5 kiloJoules and above. With this modification, the switch elements 1-6 of a switch pack 10 constructed as described and immersed in liquid helium were found capable of dissipating an initial input of up to approximately 10 kiloJoules before the lead portions 1a-6a and 1b-6b became susceptible to burning out. However, even at 10 kiloJoules, the switching portions 1c-6c inside the solid body 12 did not burn out. Under both the 5 kiloJoule and 10 kiloJoule tests, the energy was dissipated over a duration of approximately 20 seconds.

Many modifications and variations of the preferred embodiment will be apparent to those of ordinary skill in the art but will still be within the spirit and scope of the invention. For example, the switch pack 10 could be made with more or less than six switch elements. Therefore, the invention should not be limited by the scope of the preferred embodiment, but only by the claims which follow.

We claim:

1. A superconducting switch pack, comprising:

at least one switch element, said switch element including a length of superconductive wire having a switching portion and two lead portions, said switching portion being between said lead portions;

means for supporting said switching portion in a plane in a common mold;

hardened resin means encapsulating said switching portion in said plane in a solid body;

wherein the solid body has an exterior surface which is planar and substantially parallel with and spaced apart from the plane in which said switching portion is positioned, said exterior surface being exposed to the exterior of the switch pack and the resin means filling the space between the exterior surface and the plane of said switching portion so as to provide uninterrupted thermal communication between the plane of said switching portion and the exterior of the switch pack; and a heater element in thermal contact with said switching portion, said heater element being disposed along a side of said plane of the switching portion which is opposite from the exterior surface of the solid body.

2. A superconducting switch as in claim 1, wherein the length of superconducting wire of the switch element has a cupro-nickel matrix.

3. A superconducting switch pack as in claim 1, further comprising a supplemental conductor for at least one of the lead portions, each said supplemental conductor being in thermal and electrical contact with at least a portion of the length of the corresponding lead portion.

4. A superconducting switch as in claim 1, wherein the solid body is polyhedron shaped.

5. A superconducting switch as in claim 4, wherein the solid body is parallelepiped shaped.

6. A superconducting switch as in claim 1, wherein there are at least two said switch elements and the switching portions of the switch elements lie in at least two planes, the planes are parallel and spaced apart, and a heater element is disposed between the planes.

7. A superconducting switch as in claim 1, wherein there are at least two said switch elements, at least two of the switching portions of the switch elements lie in the same plane, and further comprising a heater element juxtaposed to the plane of said switching portions and in thermal contact with said switching elements.

8. A superconducting switch as in claim 1, wherein there are at least three said switch elements, the switching portions of said at least three switch elements are distributed in two planes, and further comprising a heater element between said planes and in thermal contact with said switch elements.

9. A superconducting switch as in claim 1, wherein the switching portion is bifilarly formed so that adjacent sections carry the current through the switching portion in substantially opposite directions.

10. A superconducting switch pack as in claim 1, wherein the switching portion of the switch element is formed to have a serpentine shape in the solid body.

11. A superconducting switch pack as in claim 10, comprising at least six switch elements, said switch elements being positioned in two planes with a heater element between the two planes and in thermal contact with each switch element.

12. A superconducting switch pack as in claim 10, further comprising a supplemental conductor for at least one of the lead portions, each said supplemental conductor being in thermal and electrical contact with at least a portion of the length of the corresponding lead portion.

* * * * *